United States Patent
Yang et al.

(10) Patent No.: US 7,026,695 B2
(45) Date of Patent: Apr. 11, 2006

(54) METHOD AND APPARATUS TO REDUCE PARASITIC FORCES IN ELECTRO-MECHANICAL SYSTEMS

(75) Inventors: Xiao Yang, Sunnyvale, CA (US); Shoucheng Zhang, Stanford, CA (US); Dongmin Chen, Sunnyvale, CA (US); Jie Chen, Saratoga, CA (US)

(73) Assignee: Miradia Inc., Sunnyvale, CA (US)

( * ) Notice: Subject to any disclaimer, the term of this patent is extended or adjusted under 35 U.S.C. 154(b) by 43 days.

(21) Appl. No.: 10/718,482

(22) Filed: Nov. 19, 2003

(65) Prior Publication Data
US 2005/0104144 A1    May 19, 2005

(51) Int. Cl.
*H01L 27/14* (2006.01)
(52) U.S. Cl. ............... 257/414; 257/515; 438/52
(58) Field of Classification Search ......... 257/414, 257/417, 418, 419, 420; 438/48, 52
See application file for complete search history.

(56) References Cited

U.S. PATENT DOCUMENTS

| | | | |
|---|---|---|---|
| 4,229,732 A | 10/1980 | Hartstein et al. | |
| 4,317,611 A | 3/1982 | Petersen | |
| 4,566,935 A | 1/1986 | Hornbeck | |
| 4,615,595 A | 10/1986 | Hornbeck | |
| 5,061,049 A | 10/1991 | Hornbeck | |
| 5,172,262 A | 12/1992 | Hornbeck | |
| 5,311,360 A | 5/1994 | Bloom et al. | |
| 5,382,961 A | 1/1995 | Gale, Jr. | |
| 5,448,314 A | 9/1995 | Heimbuch et al. | |
| 5,452,024 A | 9/1995 | Sampsell | |
| 5,489,952 A | 2/1996 | Gove et al. | |
| 5,504,614 A | 4/1996 | Webb et al. | |
| 5,535,047 A | 7/1996 | Hornbeck | |
| 5,583,688 A | 12/1996 | Hornbeck | |
| 5,589,852 A | 12/1996 | Thompson et al. | |
| 5,600,383 A | 2/1997 | Hornbeck | |
| 5,661,591 A | 8/1997 | Lin et al. | |
| 5,663,749 A | 9/1997 | Farris et al. | |

(Continued)

FOREIGN PATENT DOCUMENTS

EP       1237032 A2     9/2002

OTHER PUBLICATIONS

Henley et al., "A New SOI Manufacturing Technology Using Atomic layer Cleaving." Silicon Genesis Corporation Campbell CA. pp. 1-5.

(Continued)

*Primary Examiner*—Tuan H. Nguyen
(74) *Attorney, Agent, or Firm*—Townsend and Townsend and Crew LLP

(57) ABSTRACT

An electro-mechanical system, the system comprising a first surface with an electrically activated electrode coupled to the first surface and to an electrical source to receive a first signal. The system further comprising a moveable structure suspended at a first height over the first surface, the moveable structure being attracted toward the electrode based upon the first signal, and the moveable structure being attracted toward the first surface through an interaction with one or more parasitic forces. The systems also provides a landing post coupled to the moveable structure, the landing post being adapted to contact the base of the landing post against the first surface when the electrically activated electrode receives a predetermined voltage bias associated with the first signal, thereby maintaining an outer portion of the moveable structure free from physical contact with the first surface and reducing a magnitude of one or more parasitic forces.

44 Claims, 7 Drawing Sheets

U.S. PATENT DOCUMENTS

| | | |
|---|---|---|
| 5,742,419 A | 4/1998 | Dickensheets et al. |
| 5,757,536 A | 5/1998 | Ricco et al. |
| 5,771,116 A | 6/1998 | Miller et al. |
| 5,835,256 A | 11/1998 | Huibers |
| 5,885,468 A * | 3/1999 | Kozlowski ............... 216/2 |
| 5,939,171 A * | 8/1999 | Biebl .................. 428/141 |
| 5,999,306 A | 12/1999 | Atobe et al. |
| 6,038,056 A | 3/2000 | Florence et al. |
| 6,046,840 A | 4/2000 | Huibers |
| 6,049,317 A | 4/2000 | Thompson et al. |
| 6,127,756 A * | 10/2000 | Iwaki et al. ............ 310/90 |
| 6,172,797 B1 | 1/2001 | Huibers |
| 6,201,521 B1 | 3/2001 | Doherty |
| 6,252,277 B1 | 6/2001 | Chan et al. |
| 6,323,982 B1 | 11/2001 | Hornbeck |
| 6,337,760 B1 | 1/2002 | Huibers et al. |
| 6,356,378 B1 | 3/2002 | Huibers |
| 6,386,661 B1 | 5/2002 | Woerner |
| 6,396,619 B1 | 5/2002 | Huibers et al. |
| 6,429,033 B1 | 8/2002 | Gee et al. |
| 6,529,310 B1 | 3/2003 | Huibers et al. |
| 6,538,800 B1 | 3/2003 | Huibers |
| 6,542,653 B1 | 4/2003 | Wu et al. |
| 6,543,286 B1 | 4/2003 | Garverick et al. |
| 6,809,852 B1 | 10/2004 | Tao et al. |
| 6,856,068 B1 * | 2/2005 | Miller et al. ............ 310/311 |
| 2002/0041455 A1 | 4/2002 | Sawada et al. |
| 2002/0071166 A1 | 6/2002 | Jin et al. |
| 2002/0071169 A1 | 6/2002 | Bowers et al. |
| 2002/0132389 A1 | 9/2002 | Patel et al. |
| 2003/0117686 A1 | 6/2003 | DiCarlo |
| 2003/0207487 A1 * | 11/2003 | Kubena et al. ............ 438/52 |
| 2004/0000696 A1 * | 1/2004 | Ma et al. .................. 257/415 |
| 2004/0004753 A1 | 1/2004 | Pan |
| 2004/0008402 A1 | 1/2004 | Patel et al. |
| 2004/0125347 A1 | 7/2004 | Patel et al. |
| 2004/0136044 A1 | 7/2004 | Miller et al. |
| 2004/0184133 A1 | 9/2004 | Su et al. |
| 2004/0190817 A1 | 9/2004 | Aubuchon |
| 2005/0041277 A1 | 2/2005 | Huibers |

OTHER PUBLICATIONS

Petersen, K.E., Micromechanical Light Modulator Array Fabricated On Silicon. Applied Physics Letters. Oct. 15, 1977, pp. 521-523, vol. 31 No. 8.

Petersen, K.E., Micromechanical Membrane Switches On SIlicon. IBM J. Res. Develop., Jul. 1979, pp. 376-385. vol. 23, No. 4.

Larry J. Hornbeck, Digital Light Processing™: A New MEMS-Based Display Technology, Texas Instruments.

* cited by examiner

METHOD AND APPARATUS TO REDUCE PARASITIC FORCES IN ELECTRO-MECHANICAL SYSTEMS

BACKGROUND OF THE INVENTION

This present invention relates generally to manufacturing objects. More particularly, the invention provides a method and apparatus for reducing parasitic forces in electromechanical systems. Merely by way of example, the invention has been applied to a micro-electromechanical mirror array with reduced parasitic forces. The method and apparatus can be applied to other electromechanical technology as well, including actuators and sensors.

Micro-electromechanical systems (MEMS) are used in a number of application areas. For example, MEMS have been used in micro-mirror arrays, sensors, and actuators. In some of these applications, a suspended member is attracted to an electrode upon application of an electrical force and restored to an original position by a restoring force. As the suspended member approaches the electrode, surface forces can exert influences on the MEMS. These surface forces are sometimes referred to as "stiction" forces, since in some MEMS, parasitic forces arise from a combination of MEMS components sticking together and from friction, thus the term stiction. These parasitic forces may be strong enough to overcome the restoring force, resulting in an undesirable adhesion of the suspended member to the electrode.

As merely an example, conventional MEMS have relied upon a variety of techniques to overcome such stiction forces. For example, certain devices have relied upon the coating of MEMS components and the use of complex mechanical structures. Unfortunately, these techniques also have limitations. For example, some coatings are difficult to deposit on small components and can require complex deposition equipment. Moreover, complex mechanical structures may have reliability and lifetime concerns. Therefore, there is a need in the art for methods and apparatus to reduce parasitic forces in electromechanical systems.

BRIEF SUMMARY OF THE INVENTION

This present invention relates generally to manufacturing objects. More particularly, the invention provides a method and apparatus for reducing parasitic forces in electromechanical systems. Merely by way of example, the invention has been applied to a micro-electromechanical mirror array with reduced parasitic forces. The method and apparatus can be applied to other electromechanical technology as well, including actuators and sensors.

An embodiment according to the present invention provides an electromechanical system. The system includes a first surface and an electrically activated electrode coupled to the first surface. The electrically activated electrode is coupled to an electrical source to receive a first electrical signal. The system also includes a moveable structure suspended at a first height over the first surface. The moveable structure is attracted toward the electrically activated electrode based upon the first signal and attracted to the first surface through an interaction with one or more parasitic forces. The system further includes a landing post coupled to a lower side of the moveable structure. The landing post has a plurality of side surfaces defined by a height, a width, and a length and a lesser surface associated with a base. The landing post is adapted to contact the base of the landing post against the first surface when the electrically activated electrode receives a predetermined voltage bias associated with the first signal, thereby maintaining an outer portion of the moveable structure and the greater surface of the landing post free from physical contact with the first surface and reducing a magnitude of the one or more parasitic forces.

According to a specific embodiment, a portion of an upper surface of the moveable structure is adapted to reflect incident radiation. In some embodiments according to the present invention, the landing post bends when it makes contact with the first surface. In alternative embodiments, the bending of the landing post generates a force opposed to the one or more parasitic forces. The landing post may be manufactured from materials including silicon, polysilicon, metal, and dielectric materials. In some embodiments, the landing post is electrically coupled to the moveable structure.

In an alternative embodiment according to the present invention, the system further includes a landing pad coupled to the first surface, the base of the landing post being adapted to contact the landing pad when the electrically activated electrode receives the predetermined voltage bias associated with the first signal. In a particular embodiment, the landing post and the landing pad are electrically coupled to the moveable structure. In another particular embodiment, the landing pad and the landing post are maintained at equal electrical potentials. The landing pad may be manufactured from materials including silicon, polysilicon, copper, titanium, aluminum, titanium nitride, and tungsten. In a specific embodiment, the landing pad is located at an outer edge of the electrically activated electrode.

Another embodiment according to the present invention provides an electro-mechanical system. The system includes a first surface, a mounting structure extending in a direction perpendicular to the first surface, and a flexible member coupled to an upper portion of the mounting structure. The system also includes an electrically activated electrode coupled to the first surface, the electrically activated electrode being coupled to an electrical source to receive a first electrical signal. The system further includes a moveable structure coupled to the flexible member and suspended at a predetermined height over the first surface. The moveable structure is attracted toward the electrically activated electrode based upon the first electrical signal and is attracted toward the first surface through an interaction with one or more parasitic forces. The system also includes at least one extension arm coupled to the moveable structure in a plane substantially coplanar with an upper surface of the moveable structure. The extension arm is adapted to contact the first surface when the electrically activated electrode receives a predetermined voltage bias associated with the first electrical signal, thereby maintaining an outer portion of the moveable structure free from contact with the first surface and reducing a magnitude of the one or more parasitic forces.

In a particular embodiment according to the present invention, a portion of an upper surface of the moveable structure is adapted to reflect incident radiation. In another embodiment, the extension arm bends when it makes contact with the first surface, generating a force opposed to the one or more parasitic forces. In some embodiments, the extension arm features an extended portion adjacent to a recessed portion, the recessed portion effectively lengthening the extension arm. The extension arm may be manufactured from materials including silicon, polysilicon, metal, and dielectric materials. The extension arm is electrically coupled to the moveable structure in some embodiments.

An alternative embodiment according to the present invention further includes at least one landing pad coupled to the first surface. In this alternative embodiment, the extension arm is adapted to contact the landing pad when the electrically activated electrode receives the predetermined voltage bias associated with the first signal. In some embodiments, the extension arm and the landing pad are electrically coupled to the moveable structure. In other embodiments, the landing pad and the extension arm are maintained at equal electrical potentials. The landing pad may be manufactured from materials including silicon, polysilicon, copper, titanium, aluminum, titanium nitride, and tungsten.

A specific embodiment according to the present invention provides an electro-mechanical system. The system includes a first surface and a mounting structure coupled to the first surface, wherein the mounting structure extends to a first height above the first surface. The system also includes a flexible member coupled to the mounting structure and a moveable structure suspended at a second height over the first surface, wherein the moveable structure is coupled to the flexible member. The system also includes at least one electrically activated electrode located opposite the moveable structure and coupled to the first surface. The electrically activated electrode is coupled to an electrical source to receive a first electrical signal. The moveable structure is attracted toward the electrically activated electrode based upon the first electrical signal and is attracted toward the first surface through an interaction with one or more parasitic forces. A landing post is coupled to a lower side of the moveable structure. The landing post is adapted to contact a portion of the mounting structure when the electrically activated electrode receives a predetermined voltage bias associated with the first electrical signal, thereby maintaining an outer portion of the moveable structure free from physical contact with the first surface and reducing the magnitude of the one or more parasitic forces.

In a specific embodiment according to the present invention, an upper surface of the moveable structure includes a region adapted to reflect incident radiation. In another specific embodiment, the flexible member is a torsion spring. In yet another specific embodiment, the landing post bends when it makes contact with the mounting structure, generating a force opposed to the parasitic forces. The landing post may be manufactured from the group comprising silicon, polysilicon, metal, and dielectric materials. In some embodiments, the landing post is electrically coupled to the moveable structure. In other embodiments, the landing post and the support structure are maintained at equal electrical potentials.

An embodiment according to the present invention provides an electromechanical system. The system includes a first surface and a mounting structure coupled to the first surface, wherein the mounting structure extends to a first height above the first surface. The system also includes a flexible member coupled to the mounting structure and a moveable structure coupled to the flexible member and suspended at a second height over the first surface. The system also includes an electrically activated electrode located below the moveable structure and coupled to the first surface. The electrically activated electrode is coupled to an electrical source to receive a first electrical signal. The moveable structure is attracted toward the electrically activated electrode based upon the first electrical signal and is attracted toward the first surface through an interaction with one or more parasitic forces. The system further includes at least one landing pad coupled to the first surface and at least one landing post coupled to a lower side of the moveable structure. The landing post has a plurality of side surfaces defined by a height, a width, and a length and a lesser surface associated with a base and is adapted to contact the base of the landing post against the landing pad when the electrically activated electrode receives a predetermined voltage bias associated with the first electrical signal, thereby maintaining an outer portion of the moveable structure free from physical contact with the first surface and reducing the magnitude of the one or more parasitic forces.

A specific embodiment according to the present invention provides an electro-mechanical system, further including at least one extension arm coupled to the moveable structure. The extension arm is adapted to contact a landing pad when the electrically activated electrode receives the predetermined voltage bias associated with the first electrical signal, thereby maintaining a portion of the outer portion of the moveable structure free from physical contact with the first surface and reducing the magnitude of the one or more parasitic forces. In another specific embodiment, the extension arm includes an extended portion flanked on either side by two recessed portions, the recessed portions effectively extending the length of the extension arm.

An alternative embodiment according to the present invention provides an electro-mechanical system. The system includes a first surface and an electrically activated electrode coupled to the first surface, the electrically activated electrode being coupled to an electrical source to receive a first electrical signal. The system also includes a mounting structure coupled to the first surface and a flexible member coupled to the mounting structure. The system further includes a moveable structure coupled to the flexible member and suspended at a first height over the first surface. The moveable structure is attracted toward the electrically activated electrode based upon the first signal and is attracted toward the first surface through an interaction with one or more parasitic forces. The moveable structure is arrested in its motion toward the first surface by a portion of the flexible member interacting with the mounting structure when the electrically activated electrode receives a predetermined voltage bias associated with the first signal, thereby maintaining an outer portion of the moveable structure free from physical contact with the first surface and reducing a magnitude of the one or more parasitic forces.

An electro-mechanical system is provided by yet another alternative embodiment according to the present invention. The system includes a first surface and a plurality of mounting structures coupled to the first surface, wherein the mounting structures extend to at least a first height above the first surface. The system also includes a plurality of elastic members, at least one of the plurality of elastic members coupled to an associated one of the plurality of mounting structures. The system further includes a plurality of moveable structures suspended at a second height over the first surface, wherein at least one of the moveable structures is coupled to an associated one of the plurality of the elastic members. The system additionally includes a plurality of electrically activated electrodes coupled to the first surface. A first number of the plurality of electrically activated electrodes are coupled to a first electrical source to receive a first electrical signal and a third number of the plurality of the moveable structures are attracted toward the first number of the plurality of electrically activated electrodes based upon the first electrical signal. A second number of the plurality of electrically activated electrodes are coupled to a second electrical source to receive a second electrical signal and a fourth number of the plurality of the moveable structures are repelled away from the second number of the plurality of electrically activated electrodes based upon the second electrical signal. The plurality of moveable structures are attracted toward the first surface through an interaction with one or more parasitic forces. The system also includes a landing post coupled to a lower side of the plurality of moveable structures. The landing post is adapted to contact the first surface when the first number of electrically activated electrodes receives a predetermined voltage bias associated with the first electrical signal and the second number of electrically activated electrodes receives a predetermined voltage bias associated with the second electrical signal, thereby maintaining an outer periphery of the moveable structure free from physical contact with the first surface and reducing the magnitude of the one or more parasitic forces.

In a specific embodiment, an upper surface of the plurality of moveable structures includes regions characterized by different values of reflectivity. In an alternative embodiment, the plurality of moveable structures are arranged in a spatial pattern in the form of an array, such that a first one of the plurality of moveable structures creates a shadowed region on a second one of the plurality of moveable structures when the first number of electrically activated electrodes receives a predetermined voltage bias associated with the first electrical signal and the second number of electrically activated electrodes receives a predetermined voltage bias associated with the second electrical signal. The moveable structure is manufactured to align at least one region of low reflectivity with the shadowed region.

A method of operating an electro-mechanical system is provided by embodiments according to the present invention. The method includes electrically activating an electrode with a first electrical signal and generating an electric field of a first magnitude in the vicinity of the electrode. The method also includes rotating a moveable member to arrive at a first state in response to the electric field in the vicinity of the electrode and initiating contact between a first surface and a landing post coupled to a lower surface of the moveable member. The method further includes electrically activating the electrode with a second electrical signal and generating an electric field of a second magnitude in the vicinity of the electrode. The method also includes bending the landing post in response to the electric field of the second magnitude and generating a restoring force present in the landing post. The method further includes electrically activating the electrode with a third electrical signal and rotating the moveable member to a third state wherein the restoring force present in the landing post assists the rotation of the moveable member to the third state. In some embodiments according to the present invention, the electric field of the second magnitude is greater than the electric field of the first magnitude. In a specific embodiment, the restoring force present in the landing post overcomes parasitic forces present at the location where the first surface and the landing post are in contact. In another embodiment, the third electrical signal reduces the electric field in the vicinity of the electrode.

Numerous benefits are achieved using the present invention over conventional techniques. The present invention provides a means to simplify fabrication of MEMS components. Moreover, the present invention provides a flexible design that can be optimized to meet the needs of particular applications. For example, the size and position of landing posts may be modified depending on the design constraints presented by a given application. In addition, the flexibility of design extends to materials optimized for particular applications. In embodiments according to the present invention, complex coatings are not necessary to reduce parasitic forces present in the MEMS. In certain embodiments, the invention also provides a way of operating a MEMS device to overcome stiction forces. In alternative embodiments, the invention provides a MEMS design that increases the full tilt angle and the maximum operating frequency of the MEMS. Depending upon the embodiment, one or more of these benefits may exist. These and other benefits have been described throughout the present specification and more particularly below.

Various additional objects, features and advantages of the present invention can be more fully appreciated with reference to the detailed description and accompanying drawings that follow.

DETAILED DESCRIPTION OF THE INVENTION

This present invention relates generally to manufacturing objects. More particularly, the invention provides a method and apparatus for reducing parasitic forces in electromechanical systems. Merely by way of example, the invention has been applied to a micro-electromechanical mirror array with reduced parasitic forces. The method and apparatus can be applied to other electromechanical technology as well, including actuators and sensors.

Figure 1A:
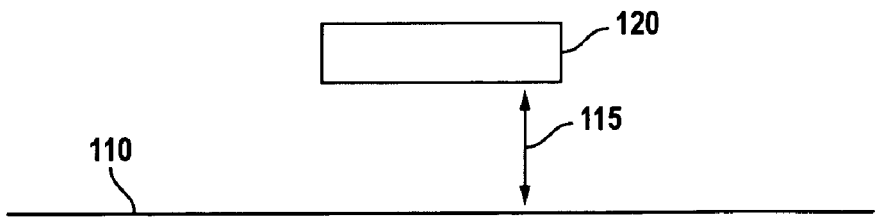
FIG. 1A is a simplified side view of a conventional electromechanical system in a first state.
Figure 1B:
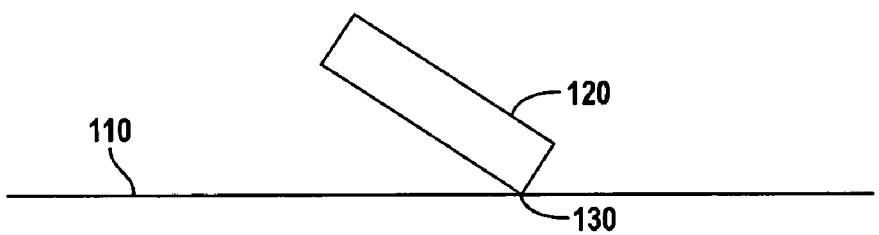
FIG. 1B is a simplified side view of a conventional electromechanical system in a modified state.

FIG. 1A is a simplified side view of a conventional electromechanical system in a first state. Suspended member 120 is suspended at a predetermined height 115 above a substrate 110. FIG. 1B is a simplified side view of a conventional electromechanical system in a modified state. As illustrated in FIG. 1B, the right side of member 120 has been brought into contact at point 130 with the substrate 110. Parasitic forces or stiction forces present in the vicinity of point 130 will attract the suspended member toward the substrate, opposing forces attempting to return the suspended member to the first state illustrated in FIG. 1A. If the suspended member becomes pinned in the position illustrated in FIG. 1B, it will not be able to transition between the first and modified states, resulting in an undesirable condition.

In many MEMS applications, parasitic forces may exert an impact on system design and performance. The magnitude of the parasitic forces observed in a MEMS depend on a variety of factors. For example, if two portions of a MEMS are in contact with each other, a parasitic force dependent on the contact area may be present. In addition, the material used in the fabrication of the MEMS may impact the magnitude of the parasitic force. In some cases, the material dependence of the force is related to Van der Waals forces. As an additional example of the factors that can impact the magnitude of parasitic forces, an increase in the humidity of the MEMS environment typically increases the magnitude of the parasitic forces.

Figure 2:
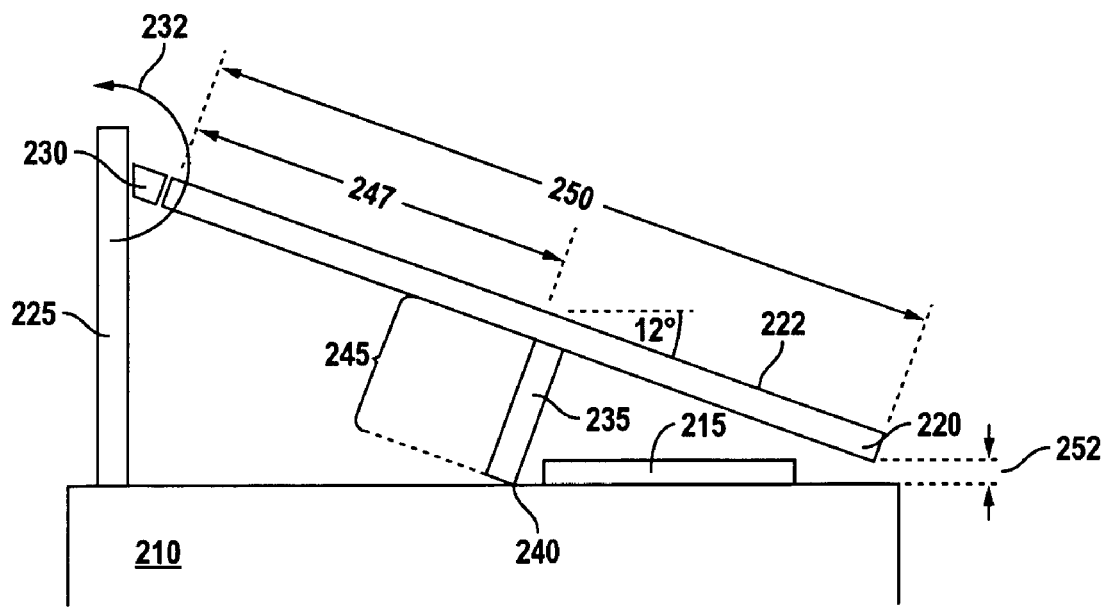
FIG. 2 is a simplified schematic side view illustration of a MEMS according to an embodiment of the present invention.

FIG. 2 is a simplified schematic side view illustration of a MEMS according to an embodiment according to the present invention. A first surface 210 is provided with at least one electrically activated electrode 215 coupled to the first surface. The first surface can be made of any suitable material. The suitable material generally has mechanical stability and an ability to be processed using semiconductor processing techniques. As merely an example, the material can be a semiconductor. Preferably, the first surface is made from a silicon wafer, processed according to semiconductor processing techniques. Other materials may also be used in alternative embodiments according to the present invention.

The electrically activated electrode is coupled to the first surface. The electrode can be made of materials that conduct electricity. Merely by way of example, the electrode in the embodiment according to the present invention illustrated in FIG. 2 is made of a metal preferentially deposited on the first surface. Preferably, the electrode is made of a deposited aluminum layer. In alternative embodiments according to the present invention, the electrode is made of titanium nitride, tungsten, or other suitable conductors.

Moveable structure 220 is attached to mounting point 225 by flexible member 230. In the embodiment illustrated in FIG. 2, a portion of the upper surface 222 of the moveable structure is a reflective surface. For example, the power reflectance of portions of upper surface 222 may be greater than or equal to 90%. Moreover, in an embodiment according to the present invention, the flexible member is a torsion spring, but this is not required by the present invention. Alternative embodiments according to the present invention use other flexible members that bend in response to applied forces and subsequently return to their original shape after removal of such applied forces.

In the state illustrated in FIG. 2 a voltage $V_A$ has been applied to the electrode 215, deflecting the right side of the moveable structure down toward the electrode and creating a restoring torque 232 in the flexible member. As the distance between the moveable structure and the first surface decreases, an interaction with one or more parasitic forces produces an force that acts on the moveable structure. In an embodiment according to the present invention, at least one landing post 235 is adapted to make contact with the first surface at location 240, thereby maintaining an outer portion of the moveable structure free from physical contact with the first surface and reducing a magnitude of one or more parasitic forces. The landing post is fabricated from suitable materials. In an embodiment according to the present invention, the landing post is fabricated from the group comprising silicon, polysilicon, metal, and dielectric materials.

In embodiments according to the present invention, the height, length, and width of the land post are predetermined values. In the embodiment illustrated in FIG. 2 the height 245 of the landing post is 2 μm. Alternatively, the height ranges from about 1 μm to about 3 μm in other embodiments. Of course, the height of the landing post will depend on the particular applications. In addition, the length and width of the landing post are predetermined values. In the embodiment illustrated in FIG. 2, the height, width, and length define a plurality of side surfaces oriented in planes generally normal to the first surface and the electrically activated electrode. In the embodiment illustrated in FIG. 2, both the individual and combined surface areas of these side surfaces is larger than the surface area of the base of the landing post. In embodiments in accordance with the present invention, the base of the landing post will contact the first surface when the moveable member is in an activated state. The small surface area of the base of the landing post will reduce the magnitude of stiction forces in comparison with the stiction forces that would result from a side surface coming into contact with the first surface.

Moreover, in embodiments according to the present invention, the distance 247 from the flexible member to the landing post is a predetermined distance. In the embodiment illustrated in FIG. 2, the distance from the flexible member to the landing post is 7 μm. Alternatively, the distance ranges from about 1 μm to about 14 μm in other embodiments. Of course, the distance from the flexible member to the landing post will depend on the particular applications. In some embodiments according to the present invention, the distance from the flexible member to the landing post is reduced to reduce the parasitic torque present at the flexible member. This parasitic torque is a function of the distance from the landing post to the flexible member and the component of the parasitic force perpendicular to the moveable structure, present at the base of the landing post, which acts on the moveable structure.

In embodiments according to the present invention, the height and position of the landing post are selected so that the upper surface of the moveable structure is tilted at a predetermined angle with respect to the horizontal when the moveable structure is in the activated state. In embodiments according to the present invention in which the upper surface of the moveable structure comprises reflective portions, an incident ray of light will be reflected at predetermined angles depending on the tilt angle of the moveable structure. In the embodiment illustrated in FIG. 2, the height and position of the landing post are selected so that the moveable structure is tilted at an angle of 12° with respect to the horizontal. Alternative embodiments have either increased or decreased tilt angles with respect to the horizontal.

Moreover, in embodiments according to the present invention, the longitudinal length of the moveable structure is a predetermined length. In the embodiment illustrated in FIG. 2, the longitudinal length 250 is 15 µm. Alternatively, the length ranges from a few microns to several hundred microns in other embodiments. Of course, the longitudinal length of the moveable structure will depend on the particular applications. Preferably, the length of the moveable structure is selected so that when the landing post makes contact with the first surface, the right edge of the moveable structure is at a predetermined distance above the first surface. In the embodiment illustrated in FIG. 2, the right edge of the moveable structure is a distance 252 above the first surface. In an embodiment according to the present invention, the distance from the right edge of the moveable structure to the first surface is 2.6 µm. Alternatively, the distance ranges from about 1.8 µm to about 3 µm in other embodiments. Depending on the application, the distance is selected to modify one or more parasitic forces and/or modify the tilt angle of the moveable structure.

In the embodiment according to the present invention illustrated in FIG. 2, the electrode is fabricated as a single electrode located below the right side of the moveable structure. Alternatively, a plurality of electrodes coupled to the first surface are used in other embodiments.

Embodiments according to the present invention provide electromechanical mirror systems configured to controllably reflect incident optical radiation. However, the present invention is applicable to a broad class of electromechanical systems in which parasitic forces are present. For many electromechanical systems, proper device functionality necessitates incorporation of design elements directed at reducing the magnitude and impact of parasitic forces. For example, many MEMS features design elements directed at reducing stiction forces. Embodiments in accordance with the present invention reduce parasitic forces in this class of electromechanical systems and particularly in MEMS. Additional details of certain features of the present electromechanical system can be found in U.S. patent application Ser. No. 60/390,389, commonly owned, and hereby incorporated by reference for all purposes.

Figure 3:
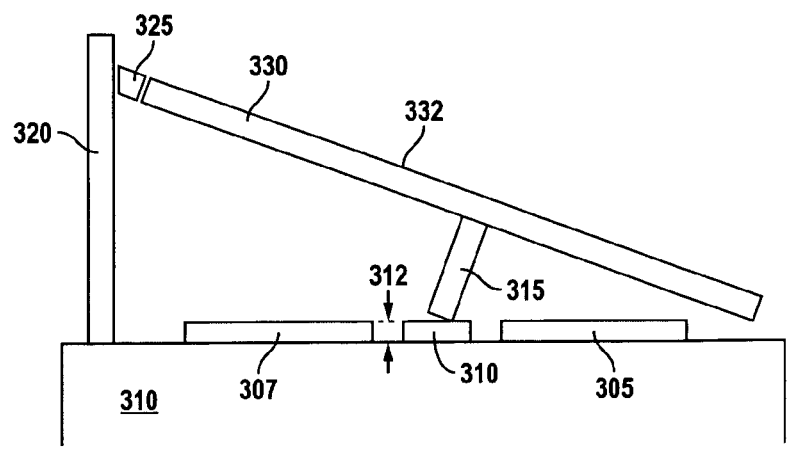
FIG. 3 is a simplified schematic side view illustration of a MEMS according to another embodiment of the present invention.

FIG. 3 is a simplified schematic illustration of a MEMS according to another embodiment according to the present invention. In the embodiment illustrated in FIG. 3, a plurality of electrodes 305 and 307 are coupled to the first surface. Additionally, landing pad 310 is coupled to the first surface. In an activated position, the landing post 315 is adapted to make contact with the landing pad. Support member 320 is coupled to first surface 310, flexible member 325 is coupled to the support member, and moveable structure 330 with reflective surface 332 is coupled to the flexible member.

In embodiments according to the present invention the landing pad is manufactured from predetermined materials. Merely by way of example, the landing pad is formed as a deposited metal in an embodiment according to the present invention. For example, the landing pad can be manufactured from aluminum, titanium nitride, tungsten, or other suitable materials. In alternative embodiments, the landing pad is manufactured from silicon, polysilicon, copper, titanium, or other conductive materials. Moreover, in embodiments according to the present invention, the height of the land pad is a predetermined height. In the embodiment illustrated in FIG. 3, the height 312 of the landing pad is 0.8 µm. Alternatively, the height ranges from about 0.1 µm to about 1.0 µm in other embodiments. Of course, the height of the landing pad will depend on the particular applications.

In embodiments of the present invention, the landing post and the landing pad are electrically coupled to other portions of the MEMS. In the embodiment illustrated in FIG. 3, the landing post is electrically coupled to the moveable structure. In addition, the landing pad is electrically coupled to the moveable structure. Thus, the electric potential of the landing pad and the electric potential of the moveable structure (and landing post) are equal. In particular embodiments according to the present invention, a bias voltage is applied to the landing pad to bring the landing pad and the moveable structure to equivalent potentials.

Figure 4A:
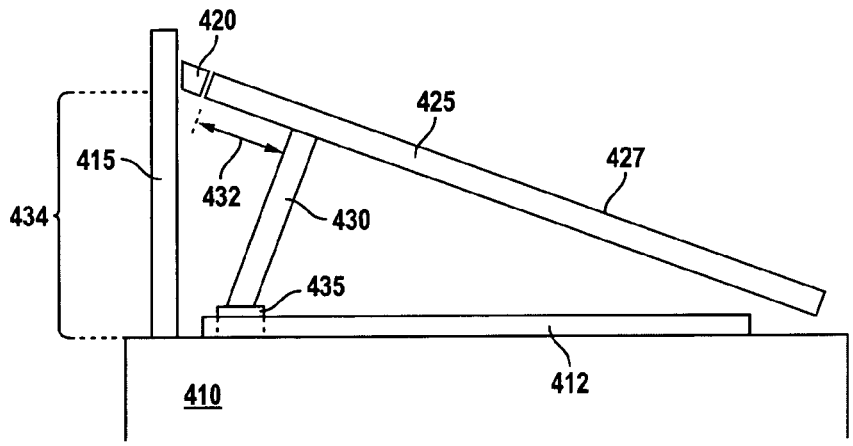
FIG. 4A is a simplified schematic side view illustration of a MEMS according to yet another alternative embodiment of the present invention.

In yet another alternative embodiment according to the present invention, the landing post is located in the vicinity of the left side of the moveable structure. FIG. 4A is a simplified schematic side view of a MEMS according to yet another alternative embodiment according to the present invention. In the embodiment illustrated in FIG. 4A, support member 415 is coupled to first surface 410, flexible member 420 is coupled to the support member, and moveable structure 425 with reflective surface 427 is coupled to the flexible member. In the embodiment illustrated in FIG. 4A, the landing post 430 is located at a position to the left of the midpoint of the moveable structure and contacts landing pad 435 when the moveable structure is in the activated position. As discussed previously, the distance 432 from the flexible member to the landing post and the height 434 of the landing post are predetermined values depending on the particular applications. In the embodiment illustrated in FIG. 4A, the distance from the flexible member to the landing post is 1.0 µm and the height of the landing post is 2.5 µm. Alternatively, the distance ranges from about 1.0 µm to about 14 µm and the height ranges from about 0.2 µm to about 2.5 µm in other embodiments.

Figure 4B:
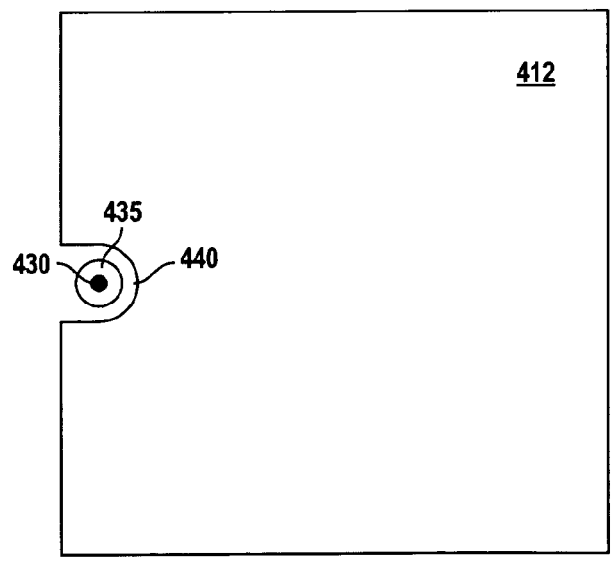
FIG. 4B is a simplified schematic top view illustration of a portion of a MEMS according to yet another alternative embodiment of the present invention.

FIG. 4B is a simplified schematic top view illustration of a portion of a MEMS according to yet another alternative embodiment according to the present invention. In FIG. 4B, the electrode 412, landing pad 435 and landing post 430 illustrated in FIG. 4A are shown. Electrode 412 is coupled to the first surface and features a U-shaped indentation 440 on the left side of the electrode. Landing post 430 makes contact with the landing pad 435 inside the U-shaped indentation 440 on the left side of the electrode. The top view of the landing post 430 is illustrated as the dark circle near the center of the U-shaped indentation. A landing pad is shown in the embodiment according to the present invention illustrated in FIGS. 4A and 4B, but this is not required. Of course, the cross-sectional circular shapes of the landing pad and landing post illustrated in FIGS. 4A and 4B are not required by the present invention. Embodiments according to the present invention use circular, rectangular, triangular, and other suitable cross-sectional shapes for either the landing post or landing pad.

Figure 5:
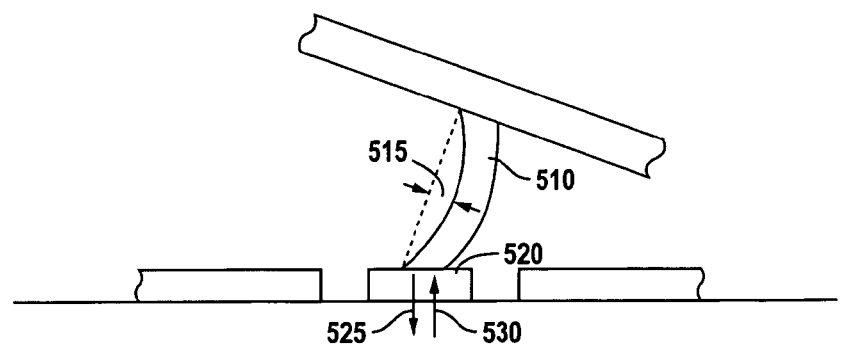
FIG. 5 is a simplified expanded schematic illustration of a region around a landing post and landing pad according to an embodiment of the present invention.

In embodiments according to the present invention, the landing post is manufactured from an elastic material, which is restored to its original shape after distortion. Moreover, the flexibility of the landing post is influenced by the shape and size of the landing post. For example, in some embodiments according to the present invention, as the length of the landing post increases, the flexibility of the landing post increases. In embodiments according to the present invention, the flexibility and elasticity of the landing post are utilized to counteract one or more parasitic forces. FIG. 5 is a simplified expanded schematic illustration of a region around a landing post and landing pad according to an embodiment of the present invention. For example, in the embodiment illustrated in FIG. 5, the landing post 510 bends a predetermined amount 515 when the landing post makes contact with the landing pad 520. Other portions of the MEMS according to this embodiment of the present invention are omitted for the sake of clarity. In the embodiment illustrated in FIG. 5, the landing post bends by an amount dependent on the force resulting from activation of the electrode, the torque present in the flexible member (not shown), and the parasitic forces. Of course, the amount of bending will depend on the particular applications.

Because, in the embodiment according to the present invention illustrated in FIG. 5, the landing post is manufactured from an elastic material, the bending of the landing post produces a restoring force 525 in the vicinity of the landing post. The restoring force is opposed to the parasitic force 530 present at the base of the landing post and the parasitic force present in the vicinity of the right edge of the moveable structure (not shown). When the electrically force is removed, the restoring force present in the landing post will combine with the restoring torque in the flexible member to oppose the combined parasitic forces. In embodiments according to the present invention, the combination of the restoring force in the landing post and restoring torque in the flexible member will be greater than the combined parasitic forces.

In an embodiment according to the present invention, the elastic nature of the landing post is utilized to assist the MEMS in overcoming parasitic forces present in the vicinity of the contact point between a landing post and the first surface. In alternative embodiments, the elastic nature of the extension arms is utilized to assist the MEMS in overcoming parasitic forces present in the vicinity of the contact point between an extension arm and the first surface. For example, in an embodiment according to the present invention, the electric field generated by the electrode is increased prior to rotation of the moveable member to a new position. In a particular embodiment, an increase in the electric field over a predetermined period of time attracts the moveable member toward the electrode, bending or increasing the amount of bending present in a landing post or extension arm. Subsequently, the electric field is decreased and potential energy stored in the elastic landing post or extension arm is released as the landing post or extension arm returns to an original shape, springing the moveable member away from the first surface.

Figure 6A:
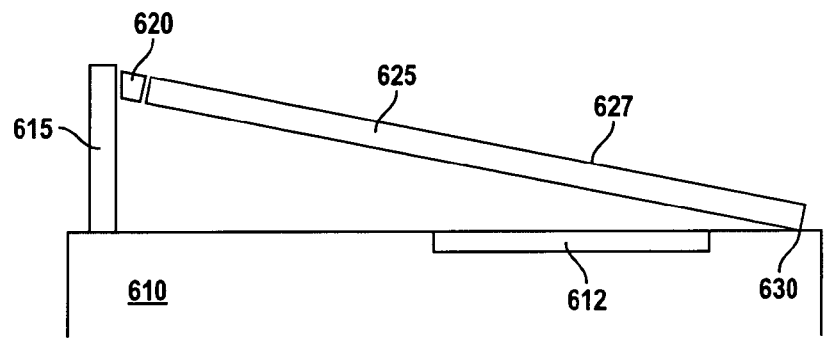
FIG. 6A is a simplified schematic side view illustration of a MEMS with at least one extension arm according to another alternative embodiment of the present invention.

FIG. 6A is a simplified schematic side view illustration of a MEMS with at least one extension arm according to another alternative embodiment of the present invention. A first surface 610 is provided with an electrically activated electrode 612 coupled to the first surface. The first surface can be made of any suitable material. The suitable material generally has mechanical stability and an ability to be processed using semiconductor processing techniques. As merely an example, the material can be a semiconductor. Preferably, the first surface is made from a silicon wafer, processed according to semiconductor processing techniques. Other materials may also be used in alternative embodiments according to the present invention.

The electrically activated electrode is coupled to the first surface. The electrode can be made of materials that conduct electricity. Merely by way of example, the electrode can be made of metals preferentially deposited on the first surface. Preferably, the electrode is made of a deposited aluminum layer. In alternative embodiments according to the present invention, the electrode is made of titanium nitride, tungsten, or other suitable conductors.

In the embodiment illustrated in FIG. 6A, support member 615 is coupled to first surface 610, flexible member 620 is coupled to the support member, and moveable structure 625 with reflective surface 627 is coupled to the flexible member. In the embodiment illustrated in FIG. 6A, a portion of the right side of the moveable structure makes physical contact with the first surface at location 630. As a result, one or more parasitic forces present at the right side of the moveable structure attract the moveable structure to the first surface.

Figure 6B:
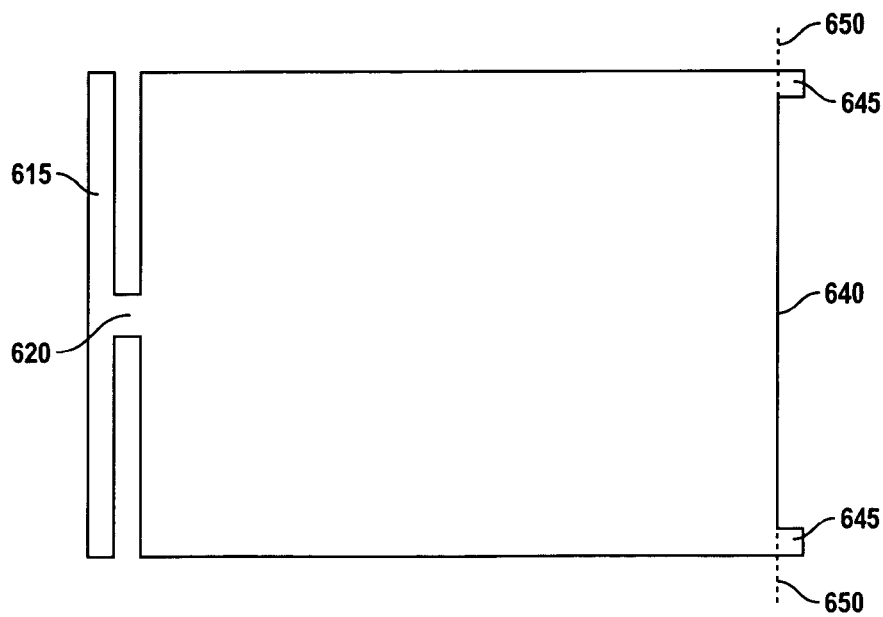
FIG. 6B is a simplified schematic top view illustration of the moveable structure used in the embodiment according to the present invention illustrated in FIG. 6A.

FIG. 6B is a simplified schematic top view illustration of the moveable structure used in the embodiment according to the present invention illustrated in FIG. 6A. In the embodiment according to the present invention illustrated in FIG. 6B, the right edge 640 of the moveable structure is fabricated to maintain an outer portion of the moveable structure free from contact with the first surface, thus reducing a magnitude of the one or more parasitic forces. In embodiments according to the present invention, an extension arm is coupled to the moveable structure in a plane coplanar with the plane of the moveable structure.

For example, as illustrated in FIG. 6B, the right edge of the moveable structure is manufactured so that at least one extension arm 645 extends to the right of a line 650. In FIG. 6B, two extension arms are present on the right side of the moveable structure, but this is not required by the present invention. In alternative embodiments according to the present invention, a single extension arm is utilized. In yet another alternative embodiment according to the present invention, more than two extension arms are used. The number, shape and size of the extension arms will depend on the applications. In embodiments according to the present invention, at least one extension arm is fabricated from the group of materials comprising silicon, polysilicon, metal, and dielectric materials.

Figure 6C:
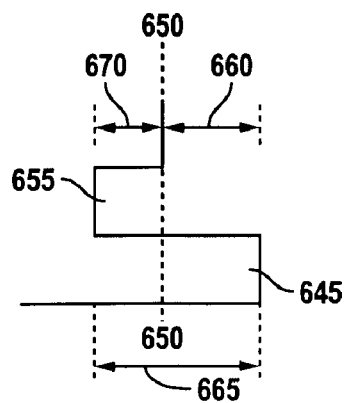
FIG. 6C is a simplified expanded schematic view of an extension arm according to an embodiment of the present invention.

FIG. 6C is a simplified expanded schematic view of an extension arm according to an embodiment of the present invention. The shape and size of the extension arm is designed to meet application parameters. Merely by way of example, the extension arm 645 illustrated in FIG. 6C not only extends a predetermined distance to the right of line 650 but is adjacent to a region of the moveable structure in which the outer periphery of the moveable structure includes a notch 655 adjacent to the extension arm. Accordingly, the effective length of the extension arm is increased from length 660 to length 665. In alternative embodiments according to the present invention, the effective length of the extension arm is increased by increasing the depth of the notch 670 or the extent 660 to which the extension arm extends to the right of line 650. In yet other alternative embodiments according to the present invention, the depth of the notch and the length of the arm are selected depending on the applications.

In an embodiment according to the present invention, at least a portion of the moveable structure is manufactured from an elastic material, which is restored to its original shape after distortion. Moreover, the flexibility of at least a portion of the moveable structure is influenced by the shape of the extension arm. For example, as illustrated in FIG. 6C, as the depth of the notch increases, the effective length of the extension arm increases, thereby increasing the flexibility of the extension arm. In an embodiment according to the present invention, the flexibility and elasticity of the extension arm is utilized to counteract one or more parasitic forces.

Figure 7:
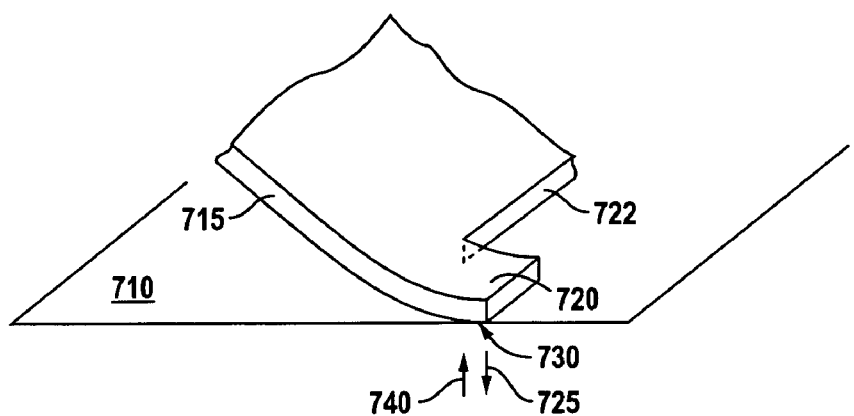
FIG. 7 is a simplified perspective side view of the front right edge of a moveable structure according to an embodiment of the present invention.

FIG. 7 is a simplified perspective side view of the front right edge of a moveable structure according to an embodiment of the present invention. The moveable structure 715 is in an activated state and the extension arm 720 is in contact with the first surface 710. The recessed portion of the moveable structure 722 is not in contact with the first surface. Parasitic force 725 is present at the contact point 730. In the embodiment according to the present invention illustrated in FIG. 7, the position of the moveable structure in the activated state has resulted in bending of the extension arm in the vicinity of point 730. Because, in the embodiment according to the present invention illustrated in FIG. 7, at least a portion of the moveable structure is manufactured from an elastic material, the bending of the extension arm produces a restoring force 740 in the vicinity of point 730. The restoring force 740 is opposed to the parasitic force 730. When the electrically force is removed, the restoring force present in the extension arm will combine with the restoring torque in the flexible member (not shown) to oppose the parasitic force. In embodiments according to the present invention, the combination of the restoring forces will be greater than the parasitic force.

Alternative embodiments according to the present invention utilize materials with a predetermined elasticity as a function of position. The elasticity may be uniform over the moveable structure or may vary. For example, the elasticity of the extension arm may be greater than the elasticity of other portions of the moveable structure. Moreover, the shape and length of the extension arm may be modified depending on the application.

Figure 8:
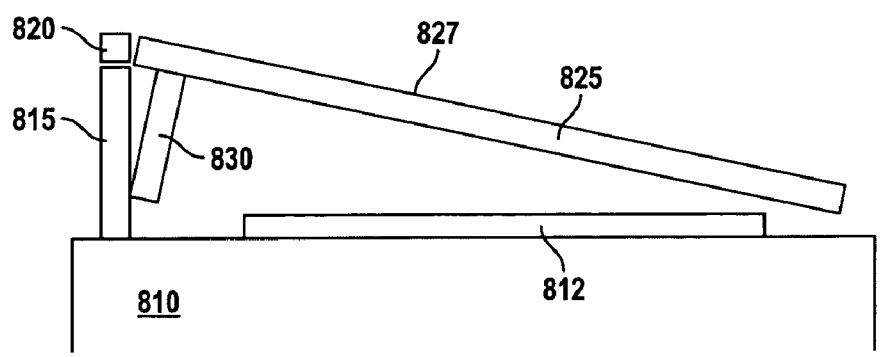
FIG. 8 is a simplified schematic side view of yet another alternative embodiment in accordance with the present invention.

FIG. 8 is a simplified schematic side view of yet another alternative embodiment in accordance with the present invention. In the embodiment illustrated in FIG. 8, a first surface 810 is provided. Mounting support 815 is coupled to flexible member 820, which in turn, is coupled to moveable structure 825 with reflective surface 827. In the embodiment illustrated in FIG. 8, the flexible member is a torsion spring. Landing post 830 is coupled to a lower surface of the moveable structure. Electrode 812 is coupled to the first surface in a manner similar to previously described embodiments. Upon activation of the electrode, the moveable structure is electrically attracted toward the electrode, resulting in a lowering of the right side of the moveable structure and generation of a restoring torque at the flexible member.

As illustrated in FIG. 8, in the activated position, the landing post is adapted to contact the mounting support when the electrically activated electrode receives a predetermined voltage bias, thereby maintaining an outer portion of the moveable structure free from physical contact with the first surface and reducing a magnitude of one or more parasitic forces present in the vicinity of the right edge of the moveable structure. Any torques created at the flexible member as a consequence of parasitic forces related to contact between the landing post and the support member are proportional to the distance from the flexible member to the landing post. Reductions in this distance produce associated reductions in parasitic torque at the flexible member.

Figure 9A:
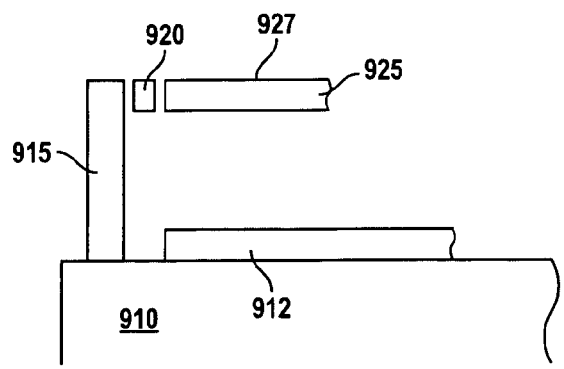
FIGS. 9A and 9B are simplified expanded schematic illustrations of an additional alternative embodiment according to the present invention.
Figure 9B:
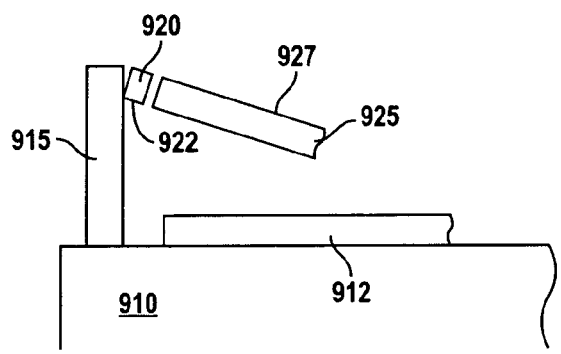

In an additional alternative embodiment according to the present invention, a flexible member coupled to a mounting support and a moveable structure acts as both a spring and a landing post. FIGS. 9A and 9B are simplified expanded schematic illustrations of an additional alternative embodiment according to the present invention. In the embodiment illustrated in FIG. 9A, a mounting support 915 is coupled to a first surface 910. Flexible member 920 is coupled to an upper portion of the mounting support and moveable structure 925 is coupled to the flexible member. In the embodiment illustrated in FIG. 9A, the flexible member is a torsion spring and the upper surface of the moveable structure comprises a reflective surface 927. The moveable structure is only partially illustrated for purposes of clarity. Electrode 912 is coupled to the first surface. Once again, the electrode is only partially illustrated for purposes of clarity. In FIG. 9A, the electrode is not activated and the moveable structure is positioned in an initial state.

Upon activation of the electrode, the moveable structure is attracted toward the first surface under the influence of an electrically force. As illustrated in FIG. 9B, in an activated state, the right side of the moveable structure is lowered toward the first surface, creating a restoring torque at the flexible member. In the embodiment illustrated in FIG. 9B, the torsion spring is fabricated to not only support a restoring torque, but to contact the mounting support when the moveable structure is in an activated state. In FIG. 9B, the lower portion 922 of the torsion spring makes contact with the support member, thereby maintaining an outer portion of the moveable structure free from physical contact with the first surface and reducing a magnitude of one or more parasitic forces.

Alternative embodiments of the present invention utilize moveable structures of various geometries. In the embodiment illustrated in FIG. 10A, the moveable structure is fabricated in the shape of a diamond. However, this diamond shaped geometry is not required by the present invention. For example, moveable structures fabricated in the shape of other polygons are utilized in alternative embodiments.

Figure 10A:
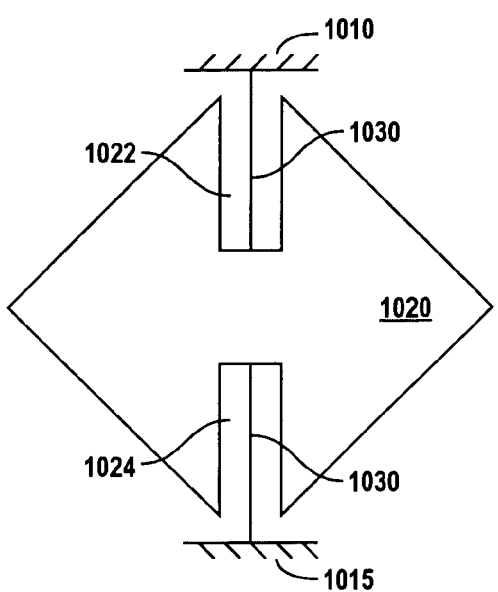
FIG. 10A is a simplified schematic top view of a MEMS according to an embodiment of the present invention with a moveable structure fabricated in the shape of a diamond.

FIG. 10A is a simplified schematic top view of a MEMS according to an embodiment of the present invention with a moveable structure fabricated in the shape of a diamond. Support members 1010 and 1015 are located at either side of the moveable structure 1020. A flexible member 1030 is coupled to the support members on either side of the moveable structure and to a lower surface of the moveable structure. In an embodiment according to the present invention, the flexible member is a torsion spring, but this is not required by the present invention. The moveable structure is free to rotate around the line collinear with the flexible member, providing one degree of freedom. In FIG. 10A, the central portions of the moveable structure 1022 and 1024 have been removed for purposes of clarity of illustration, but this is not required. In the embodiment illustrated in FIG. 10A, the horizontal width of the moveable structure is 15 μm. In alternative embodiments according to the present invention, the horizontal width of the moveable structure ranges from a few microns to several hundreds of microns. In the embodiment illustrated in FIG. 10A, the horizontal width of the flexible member is 0.18 μm and the vertical length of the flexible member is 8 μm. Alternatively, the width of the flexible member ranges from about 0.1 μm to about 0.6 μm and the length of the flexible member ranges from about 1.0 μm to about 10 μm in other embodiments. Of course, the dimensions of the moveable structure and the flexible member will depend on the particular applications.

Figure 10B:
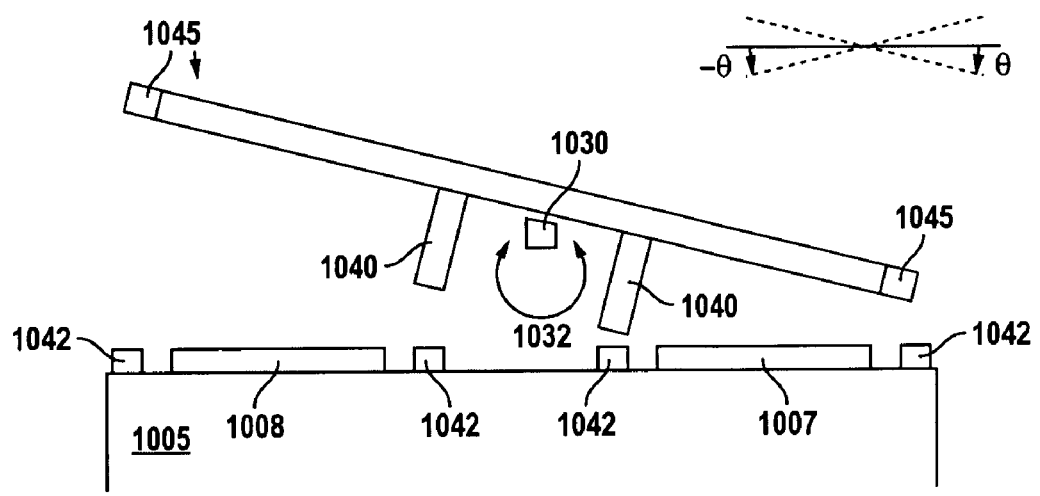
FIG. 10B is a simplified schematic side view of a MEMS according to an embodiment of the present invention with a moveable structure coupled to a central flexible member.

FIG. 10B is a simplified schematic side view of a MEMS according to an embodiment of the present invention utilizing a moveable structure coupled to a central flexible member. First surface 1005 is provided with at least one electrode 1007 and/or 1008 coupled to the first surface. In FIG. 10B, the support members are not illustrated. A flexible member 1030 is coupled to the support members on either side of the moveable structure and to a lower surface of the moveable structure. In the embodiment according to the present invention illustrated in FIG. 10B, the flexible member is a torsion spring, but this is not required by the present invention. In FIG. 10B, the torsion spring extends into the plane of the figure, allowing the moveable structure freedom to rotate around the line collinear with the torsion spring in the directions represented by arrow 1032. In the alternative embodiment according to the present invention illustrated in FIGS. 10A and 10B, at least one landing post 1040 and/or at least one extension arm 1045 are adapted to make contact with either the first surface and/or at least one landing pad 1042 when at least one electrode receives a predetermined voltage bias associated with a first signal, thus maintaining an outer portion of the moveable structure free from physical contact with the first surface and reducing a magnitude of one or more parasitic forces.

The MEMS illustrated in FIG. 10B utilizes a plurality of electrodes coupled to the first surface. Accordingly, electrical activation of the electrodes can be performed in concert to simultaneously attract one side of the moveable structure toward the first surface while repelling the other side of the moveable structure away from the first surface. For example, in FIG. 10B, the left electrode 1008 is activated with a first signal to electrically repel the moveable structure away from the first surface. Simultaneously, the right electrode 1007 is activated with a second signal to electrically attract the moveable structure toward the first surface. Subsequent analogous "push-pull" electrical signals can be used to tilt the moveable structure in the opposite direction. As will be evident to one of skill in the art, the "push" repulsive force will initially be greater in magnitude than the "pull" force, since the electrostatic force between two separated charges is inversely proportional to the square of the distance separating the charges.

In some embodiments according to the present invention, the frequency at which the moveable structure can be transitioned from a first state to a second state is increased by use of multiple electrodes. For example, in the embodiment illustrated in FIG. 10B, the moveable structure is illustrated in a first state in which the normal to the top surface of the moveable structure is directed to the right of the vertical. In an embodiment according to the present invention, to transition the moveable structure to a second state, in which the normal to the top surface of the moveable structure is directed to the left of the vertical, an electrostatic repulsive force is applied to electrode 1007 and an electrostatic force is applied to electrode 1008. The close proximity of the electrode 1007 and the right side of the moveable structure in the first state results in a large electrostatic force for a given electric potential applied to the electrode. For example, if an equal electric potential is applied to electrodes 1007 and 1008, the larger distance between the left side of the moveable structure and electrode 1008 will result in an force of smaller absolute value than the repulsive force present at electrode 1007. As the moveable structure transitions to the second state, the reduced proximity between the left side of the moveable structure and electrode 1008 will results in an increased force for a given electric potential applied to the electrode. The increased acceleration experienced by the side of the moveable structure closest to the first surface will thus increase the frequency at which transitions between states can be accomplished, in comparison with a single electrode embodiment.

In the embodiment illustrated in FIG. 10B, the landing posts 1040 are coupled to a lower surface of the moveable structure and are located at a predetermined distance from the torsion spring. The distance from the torsion spring and the height of the landing post are determined as described in previously described embodiments. The distances from the torsion spring to the twin landing posts illustrated in FIG. 10B are equal, but this is not required. Landing pads 1042 coupled to the first surface are also illustrated in FIG. 10B. As previously described, the height, shape, and materials used to fabricate the landing pads will depend on the particular applications. Electrical coupling of the landing posts and landing pads and other portions of the MEMS as previously described will depend on the particular applications.

Additionally, extension arms 1045 are illustrated in FIG. 10B. Although two extension arms are illustrated, this is not required by the present invention. Landing pads 1042 are used in the embodiment illustrated in FIG. 10B, but this is not required by the present invention. As previously described, the shape and materials used to fabricate the extension arms will depend on the particular applications. Moreover, as previously described, the height, shape, and materials used to fabricate the landing pads will depend on the particular applications.

Figure 10C:
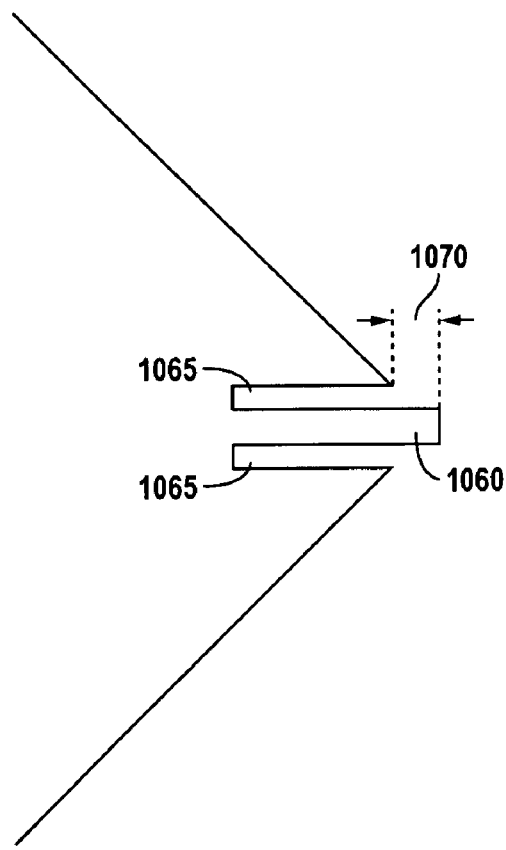
FIG. 10C is a simplified expanded schematic view of an extension arm according to an embodiment of the present invention utilizing a moveable structure fabricated in the shape of a diamond.

FIG. 10C is a simplified expanded schematic view of an extension arm according to an embodiment of the present invention utilizing a moveable structure fabricated in the shape of a diamond. In embodiments according to the present invention, the size and shape of the extension arm will depend on the particular applications. In the embodiment illustrated in FIG. 10C, a single extension arm is utilized, but this is not required, as there could be more than one extension arm utilized. In FIG. 10C, extension arm 1060 is located near the right periphery of the diamond shaped moveable structure. On either side of the extension arm, a notch 1065 is fabricated running parallel to the length of the extension arm. The length of the extension arm thus depends on the depth of the notch 1065 and the distance 1070 from the end of the extension arm to the top of the notches. The notches illustrated in FIG. 10C are of equal depth, but this is not required by the present invention. Alternative embodiments according to the present invention locate the extension arm at other locations on the moveable structure and feature fewer or greater numbers of notches and extension arms.

Figure 11A:
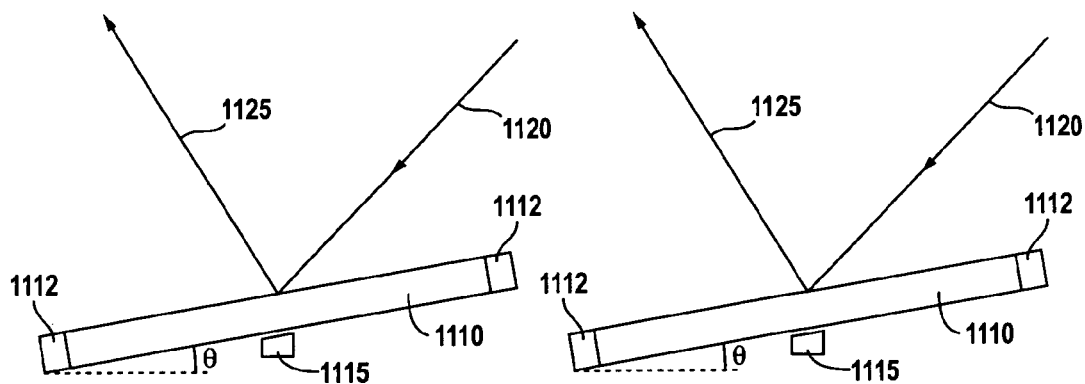
FIG. 11A is a simplified schematic illustration of an array of moveable structures in a first state according to an embodiment of the present invention.

FIG. 11A is a simplified schematic illustration of an array of moveable structures in a first state according to an embodiment of the present invention. Merely by way of example, in an alternative embodiment according to the present invention, the moveable structures are reflective electromechanical mirrors. Moveable structures 1110 with extension arms 1112 are coupled to flexible members 1115. In the embodiment according to the present invention illustrated in FIGS. 11A and 11B, the flexible members are torsion springs, but this is not required by the present invention. Additional mounting locations, electrodes, and landing posts are not illustrated in FIGS. 11A and 11B for purposes of clarity. In the embodiment illustrated in FIG. 11A, the moveable structures are positioned in a first state characterized by a tilt angle $\theta$. The tilt angle $\theta$ in this embodiment is measured with respect to the horizontal. An example of an array of moveable structures in this first state would be a state in which the moveable structures reflect incident radiation 1120, incident on the array at a first predetermined angle, generating reflected radiation 1125, directed at a second predetermined angle. For example, the second predetermined angle could be aligned with a light dump (not shown) so that incident radiation is generally absorbed. In some embodiments according to the present invention, this first state is referred to as an "OFF" state.

Figure 11B:
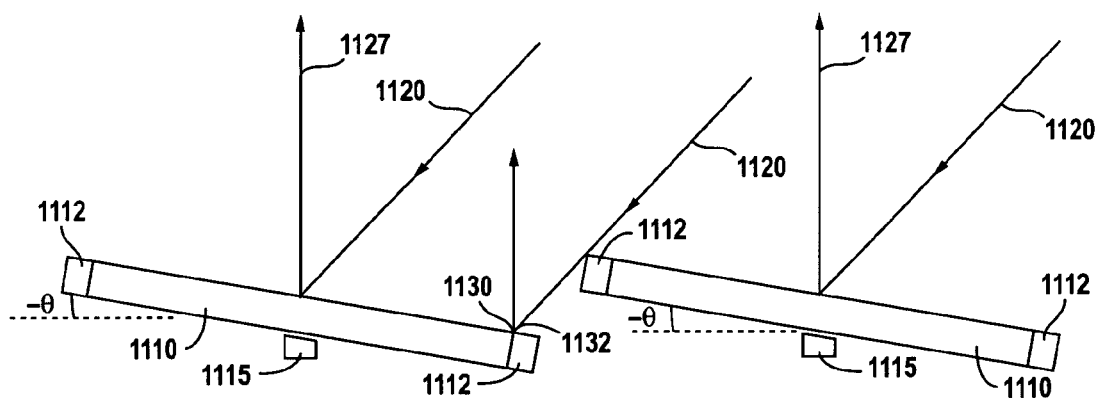
FIG. 11B is a simplified schematic illustration of an array of moveable structures in a second state according to an embodiment of the present invention.

FIG. 11B is a simplified schematic illustration of an array of moveable structures in a second state according to an embodiment of the present invention. Moveable structures 1110 with extension arms 1112 are coupled to torsion springs 1115. In the embodiment illustrated in FIG. 11B, the moveable structures are positioned in a second state characterized by a tilt angle −θ. The tilt angle −θ in this embodiment is measured with respect to the horizontal. An example of an array of moveable structures in this second state would be a state in which the moveable structures reflect incident radiation 1120, incident on the array at a first predetermined angle, generating reflected radiation 1127, directed at a third predetermined angle. For example, the third predetermined angle could be aligned with a projection screen. In some embodiments according to the present invention, this second state is referred to as an "ON" state.

In embodiments in accordance with the present invention as illustrated in FIGS. 11A and 11B, the tilt angle is a predetermined angle. For example, the moveable structure illustrated in FIG. 11A tilts at an angle θ with respect to the horizontal in a counter-clockwise direction. Additionally, the moveable structure in FIG. 11B tilts at an angle −θ with respect to the horizontal in a clockwise direction. Thus, the full tilt angle provided by the embodiment according to the present invention illustrated in FIGS. 11A and 11B is 2θ. In a particular embodiment according to the present invention, the full tilt angle is 12° on each side for a full tilt angle of 24°. Alternatively, the full tilt angle ranges from about 10° to about 40° in other embodiments. Of course, the range of the full tilt angle will depend on the particular applications.

The conventional electro-mechanical system illustrated in FIG. 1A and 1B featured a moveable structure that was initially in a horizontal position and rotated in a clockwise direction to arrive at a second position. The two states of the system illustrated in FIG. 1A and 1B alternate between a horizontal and a tilted position. In contrast, the embodiment according to the present invention illustrated in FIGS. 11A and 11B transitions over a range of 2θ, starting at an initial state that is already tilted at an angle of θ and moving to a position that is tilted at an angle of −θ. Thus, the total range of accessible tilt angles (full tilt range) available from the embodiment illustrated in FIG. 11B exceeds the full tilt range available with the conventional design illustrated in FIGS. 1A and 1B.

Figure 11C:
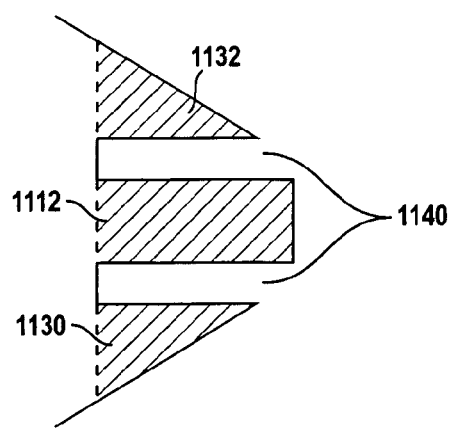
FIG. 11C is a simplified expanded schematic view of an extension arm according to an embodiment of the present invention.

In the state illustrated in FIG. 11B, the moveable structures are positioned to reflect the incident radiation 1120 in a direction 1127 aligned with the vertical. Incident radiation impinging on the array at the leftmost edge of the right moveable structure impinges on the left moveable structure at location 1130. Thus, a shadowed region 1132 is present in the vicinity of the right edge of the left moveable structure. In an embodiment according to the present invention, the dimensions of the shadowed region 1132 correspond to the dimensions of the extension arms 1112. FIG. 11C is a simplified expanded schematic view of an extension arm according to an embodiment of the present invention. Location 1130 is illustrated as the dashed line in FIG. 11C. The shadowed region 1132 illustrated in FIG. 11B is illustrated in FIG. 11C as a shaded region. In a specific embodiment according to the present invention, the array design is adapted to align the shadowed region with the extension arm area. Thus, any loss of reflected radiation due to the presence of notches 1140 does not impact the percentage of radiation reflected from the moveable structure, since the notches are shadowed by the adjacent moveable structure. In alternative embodiments according to the present invention, portions of the moveable structure with low reflectivity are aligned with one or more shadowed regions present in the MEMS. For example, in an alternative embodiment, surfaces with power reflectance less than 80% are considered to be low reflectivity surfaces.

Embodiments according to the present invention with an array of moveable structures as illustrated in FIGS. 6A and 6B may also utilize alignment of a shadowed area with one or more extension arms.

The invention has been explained with reference to specific embodiments. Other embodiments will be evident to those skilled in the art. It is not intended that the invention be limited, except as indicated by the appended claims.

What is claimed is:

1. An electro-mechanical system comprising:
   a first surface;
   an electrically activated electrode coupled to the first surface, the electrically activated electrode being coupled to an electrical source to receive a first electrical signal;
   a moveable structure suspended at a first height over the first surface, the moveable structure being attracted toward the electrically activated electrode based upon the first signal, the moveable structure being attracted toward the first surface through an interaction wit one or more parasitic forces; and
   a landing post coupled to a lower side of the moveable structure, the landing post having a plurality of side surfaces defined by a height, a width, and a length end a lesser surface associated with a base, the leading post being adapted to contact the base of the landing post against the first surface when the electrically activated electrode receives a predetermined voltage bias associated with the first signal, thereby maintaining an outer portion of the moveable structure and the greater surface of the landing post free from physical contact with the first surface and reducing a magnitude of the one or more parasitic forces,
   wherein the landing post bends when it makes contact with the first surface.

2. The electro-mechanical system of claim 1 wherein a portion of an upper surface of the moveable structure is adapted to reflect incident radiation.

3. The electro-mechanical system of claim 2 wherein the portion of the upper surface of to moveable structure is characterized by a power reflectance greater than or equal to 90%.

4. The electro-mechanical system of claim 1 wherein the bending of the lending post generates a force opposed to the one or more parasitic forces.

5. The electro-mechanical system of claim 1 wherein the landing post is manufactured from the group comprising silicon, polysilicon, metal, and dielectric materials.

6. The electro-mechanical system of claim 1 wherein the landing post is electrically coupled to the moveable structure.

7. The electro-mechanical system of claim 1 wherein the comprising a landing pad coupled to the first surface, the base of the landing pad being adapted to contact the landing pad when the electrically activated electrode receives the predetermined voltage bias associated with the first signal.

8. The electro-mechanical system of claim 7 wherein the landing post and the landing pad are electrically coupled to the moveable structure.

9. The electro-mechanical system of claim 8 wherein the landing pad and the landing post are maintained at equal electrical potentials.

10. The electro-mechanical system of claim 7 wherein the landing pad is selected from the group comprising silicon, polysilicon, copper, titanium, aluminum, titanium nitride, and tungsten.

11. The electro-mechanical system of claim 7 wherein the landing pad is located at an outer edge of the electrically activated electrode.

12. An electro-mechanical system comprising:
a first surface;
a mounting structure extending in a direction perpendicular to the first surface;
a flexible member coupled to an upper portion of the mounting structure;
an electrically activated electrode coupled, to the first surface, the electrically activated electrode being coupled to an electrical source to receive a first electrical signal;
a moveable structure coupled to the flexible member and suspended at a predetermined height over the first surface, the moveable structure being attracted toward the electrically activated electrode based upon the first electrical signal, the moveable structure being attracted toward the first surface through an interaction with one or more parasitic forces; and
at least one extension arm coupled to the moveable structure in a plane substantially coplanar with an upper surface of the movable structure, the extension arm being adapted to contact the first surface when the electrically activated electrode receives a predetermined voltage bias associated with the first electrical signal, thereby maintaining an outer portion of the moveable structure free from contact with the first surface and reducing a magnitude of the one or more parasitic forces,
wherein the at least one extension arm comprises an extended portion adjacent to a recessed portion, the recessed portion effectively lengthening the at least one extension arm.

13. The electro-mechanical system of claim 12 wherein a portion of an upper surface of the moveable structure is adapted to reflect incident radiation.

14. The electro-mechanical system of claim 13 wherein the portion of the upper surface of the moveable structure is characterized by a power reflectance greater than or equal to 90%.

15. The electro-mechanical system of claim 12 wherein the at least one extension arm bends when it makes contact with the first surface.

16. The electro-mechanical system of claim 15 wherein the bending of the at least one extension arm generates a force opposed to the one or more parasitic forces.

17. The electro-mechanical system of claim 12 wherein the at least one extension arm is manufactured from to group comprising silicon, polysilicon, metal, and dielectric materials.

18. The electro-mechanical system of claim 12 wherein the at least one extension arm is electrically coupled to the moveable structure.

19. The electro-mechanical system of claim 12 further comprising at least one landing pad coupled to the first surface, the at least one extension arm being adapted to contact the at least one landing pad when the electrically activated electrode receives the predetermined voltage bias associated with the first signal.

20. The electro-mechanical system of claim 19 wherein the at least one extension arm and the at least one landing pad are electrically coupled to the moveable structure.

21. The electro-mechanical system of claim 19 wherein the at least one landing pad and the at least one extension arm are maintained at equal electrical potentials.

22. The electro-mechanical system of claim 19 wherein the at least one landing pad is manufactured from the group comprising silicon, polysilicon, copper, titanium, aluminum, titanium nitride, and tungsten.

23. An electro-mechanical system comprising:
a first surface;
a mounting structure coupled to the first surface wherein the mounting structure extends to a first height above the first surface;
a flexible member coupled to the mounting structure;
a moveable structure suspended at a second height over the first surface, wherein the moveable structure is coupled to the flexible member;
at least one electrically activated electrode located opposite the moveable structure and coupled to the first surface, the at least one electrically activated electrode being coupled to an electrical source to receive a first electrical signal, wherein the moveable structure is attracted toward the at least one electrically activated electrode based upon the first electrical signal, the moveable structure being attracted toward the first surface through an interaction with one or more parasitic forces; and
a landing post coupled to a lower side of the moveable structure, the landing post being adapted to contact a portion of the mounting structure when the at least one electrically activated electrode receives a predetermined voltage bias associated with the first electrical signal, thereby maintaining an outer portion of the moveable structure free from physical contact with the first surface and reducing the magnitude of the one or more parasitic faces a
wherein the flexible member is a torsion spring.

24. The electro-mechanical system of claim 23 wherein an upper surface of the moveable structure comprises a region adapted to reflect incident radiation.

25. The electro-mechanical system of claim 24 wherein the region adapted to reflect incident radiation is characterized by a power reflectance of greater than or equal to 90%.

26. The electro-mechanical system of claim 23 wherein the landing post bends when it makes contact with the mounting structure.

27. The electro-mechanical system of claim 26 wherein the bending of the landing post generates a force opposed to the one or more parasitic forces.

28. The electro-mechanical system of claim 23 wherein the landing post is manufactured from the group comprising silicon, polysilicon, metal, and dielectric materials.

29. The electro-mechanical system of claim 23 wherein the landing post is electrically coupled to the moveable structure.

30. The electro-mechanical system of claim 23 wherein the landing post and the support structure are maintained at equal electrical potentials.

31. An electro-mechanical system comprising:
a first surface;
a mounting structure coupled to the first surface wherein the mounting structure extends to a first height above the first surface;
a flexible member coupled to the mounting structure;

a moveable structure coupled to the flexible member and suspended at a second height over the first surface;

an electrically activated electrode located below the moveable structure and coupled to the first surface, the electrically activated electrode being coupled to an electrical source to receive a first electrical signal, wherein the moveable structure is attracted toward the electrically activated electrode based upon the first electrical signal, the movable structure being attracted toward the first surface through an interaction with one or more parasitic forces;

at least one landing pad coupled to the first surface;

at least one landing post coupled to a lower side of the moveable structure, the landing post having a plurality of side surfaces defined by a height, a width, and a length and a lesser surface associated with a base, the landing post being adapted to contact the base of the landing post against the at least one landing pad when the electrically activated electrode receives a predetermined voltage bias associated with the first electrical signal, thereby maintaining an outer portion of the moveable structure free from physical contact with the first surface and reducing the magnitude of the one or more parasitic forces; and at least one extension arm coupled to the moveable structure, the at least one extension arm being adapted to contact the at least one landing pad when the electrically activated electrode receives the predetermined voltage bias associated with the first electrical signal, thereby maintaining a portion of the outer portion of the moveable structure free from physical contact with the first surface and reducing the magnitude of the one or more parasitic forces, wherein the at least one extension arm comprises an extended portion flanked on either side by two recessed portions, the recessed portions effectively extending the length of the extension arm.

32. The electro-mechanical system of claim 31 wherein a portion of an upper surface of the moveable structure is adapted to reflect incident radiation.

33. The electro-mechanical system of claim 32 wherein the portion of the upper surface of the moveable structure is characterized by a power reflectance greater than or equal to 90%.

34. The electro-mechanical system of claim 31 wherein the landing post is manufactured from the group comprising silicon, polysilicon, metal, and dielectric materials.

35. The electro-mechanical system of claim 31 further comprising a landing pad coupled to the first surface, the base of the landing post being adapted to contact the landing pad when the electrically activated electrode receives the predetermined voltage bias associated with the first signal.

36. The electro-mechanical system of claim 35 wherein the landing pad is selected from the group comprising silicon, polysilicon, copper, titanium, aluminum, titanium nitride, and tungsten.

37. An electro-mechanical system comprising:

a first surface;

a plurality of mounting structures coupled to the first surface wherein the mounting structures extend to at least a first height above the first surface;

a plurality of elastic members, at least one of the plurality of elastic members coupled to an associated one of the plurality of mounting structures;

a plurality of moveable structures suspended at a second height over the first surface, wherein at least one of the moveable structures is coupled to an associated one of the plurality of the elastic members;

a plurality of electrically activated electrodes coupled to the first surface, a first number of the plurality of electrically activated electrodes being coupled to a first electrical source to receive a first electrical signal, wherein a third number of the plurality of the moveable structures are attracted toward the first number of the plurality of electrically activated electrodes based upon the first electrical signal, and a second number of the plurality of electrically activated electrodes being coupled to a second electrical source to receive a second electrical signal, wherein a fourth number of the plurality of the moveable structures are repelled away from the second number of the plurality of electrically activated electrodes based upon the second electrical signal, the plurality of moveable structures being attracted toward the first surface through an interaction with one or more parasitic forces; and a landing post coupled to a lower side of the plurality of moveable structures, the landing post being adapted to contact the first surface when the first number of electrically activated electrodes receives a predetermined voltage bias associated with the first electrical signal and the second number of electrically activated electrodes receives a predetermined voltage bias associated with the second electrical signal, thereby maintaining an outer periphery of the moveable structure free from physical contact with the first surface and reducing the magnitude of the one or more parasitic forces.

38. The electro-mechanical system of claim 37 wherein an upper surface of the plurality of moveable structures comprises regions characterized by different values of reflectivity.

39. The electro-mechanical system of claim 37 wherein the plurality of moveable structures are arranged in a spatial pattern in the form of an array, such that a first one of the plurality of moveable structures creates a shadowed region on a second one of the plurality of moveable structures when the first number of electrically activated electrodes receives a predetermined voltage bias associated with the first electrical signal and the second number of electrically activated electrodes receives a predetermined voltage bias associated with the second electrical signal, the moveable structure manufactured to align at least one region of low reflectivity with the shadowed region.

40. The electro-mechanical system of claim 39 wherein the at least one region of low reflectivity is a region characterized by power reflectance less than 90%.

41. A method of operating an electro-mechanical system comprising:

electrically activating an electrode with a first electrical signal;

generating an electric field of a first magnitude in the vicinity of the electrode;

rotating a moveable member to arrive at a first state in response to the electric field in the vicinity of the electrode;

initiating contact between a first surface and a landing post coupled to a lower surface of the moveable member;

electrically activating the electrode with a second electrical signal;

generating an electric field of a second magnitude in the vicinity of the electrode;

bending the landing post in response to the electric field of the second magnitude and generating a restoring force present in the landing post;

electrically activating the electrode with a third electrical signal; and rotating the moveable member to a third state wherein the restoring force present in the landing post assists the rotation of the moveable member to the third state.

42. The method of claim 41 wherein the electric field of the second magnitude is greater than the electric field of the first magnitude.

43. The method of claim 41 wherein the restoring force present in the landing post overcomes parasitic forces present at the location where thin first surface and the landing post are in contact.

44. The method of claim 41 wherein the third electrical signal reduces the electric field in the vicinity of the electrode.

* * * * *